United States Patent
Abernathy et al.

(10) Patent No.: US 6,820,227 B2
(45) Date of Patent: Nov. 16, 2004

(54) METHOD AND APPARATUS FOR PERFORMING ERROR CHECKING

(75) Inventors: Christopher Michael Abernathy, Austin, TX (US); Gilles Gervais, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 530 days.

(21) Appl. No.: 09/998,398

(22) Filed: Nov. 15, 2001

(65) Prior Publication Data

US 2003/0093738 A1 May 15, 2003

(51) Int. Cl.[7] ............................................. G01R 31/28
(52) U.S. Cl. ..................... 714/731; 714/727; 714/729
(58) Field of Search ............................. 714/25, 48, 52, 714/57, 731, 727, 729, 726, 724, 746; 375/343; 709/227

(56) References Cited

U.S. PATENT DOCUMENTS

| | | | | |
|---|---|---|---|---|
| 4,100,605 A | * | 7/1978 | Holman | 714/25 |
| 4,167,041 A | * | 9/1979 | Curlander et al. | 714/48 |
| 4,371,949 A | * | 2/1983 | Chu et al. | 714/52 |
| 5,224,127 A | * | 6/1993 | Okanoue | 375/343 |
| 6,536,000 B1 | * | 3/2003 | Jackson et al. | 714/57 |
| 6,694,367 B1 | * | 2/2004 | Miesbauer et al. | 709/227 |

* cited by examiner

*Primary Examiner*—David Ton
(74) *Attorney, Agent, or Firm*—Carr LLP; Robert M. Carwell

(57) ABSTRACT

A method and an apparatus for suppressing errors reported by an error check function of a circuit. The method and apparatus utilizes a shifter to provide an enablement bit for the error reporting. An error is reported only if the enablement bit is set such that it allows the error to be latched through the circuit.

16 Claims, 3 Drawing Sheets

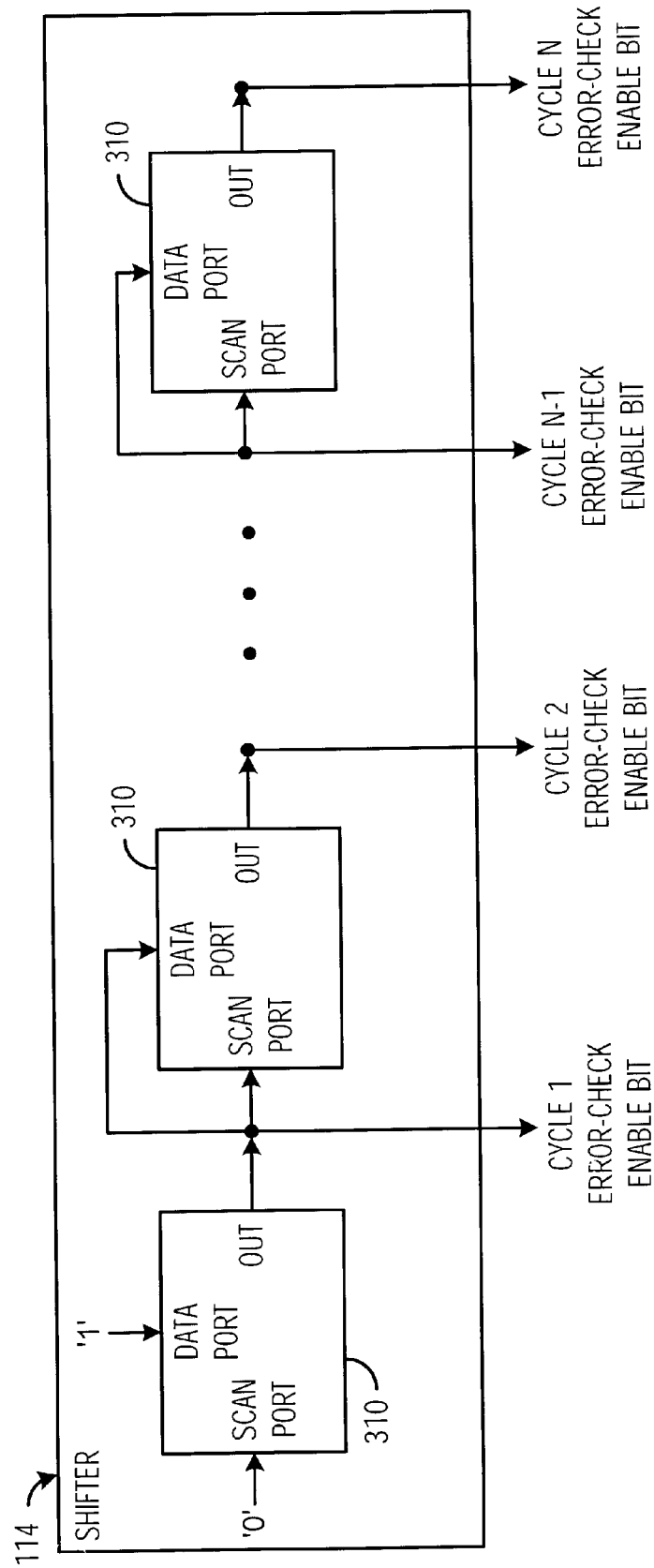

METHOD AND APPARATUS FOR PERFORMING ERROR CHECKING

BACKGROUND OF THE INVENTION

1. Field of the Invention

The invention relates generally to computer architectures and, more particularly, to a method and an apparatus for performing error checking enablement in a computer.

2. Description of Related Art

Upon initialization, electronic components, such as processors, generally perform self-tests on power-up, which is commonly referred to as power-on-reset (POR). The POR typically involves setting latches within the processor to known states, such as logical zeros. After coming out of POR, error-checking logic verifies that the condition of certain signals, i.e., latches, is as expected. The error-checking logic reports an error condition if the circuits do not match the expected values.

Many latches, however, are connected in a serial fashion within a pipeline, and may require two or more clock cycles before reaching a known valid state (in other words, invalid states may exist in the latches directly after coming out of POR). In order to verify the operation of these circuits, therefore, additional logic and/or circuitry is required to prevent an error condition from being reported prior to the complete initialization of the circuit. Furthermore, the additional logic and/or circuitry usually creates additional problems, such as debugging problems, and/or requires additional resources, such as a validity bit.

Therefore, there is a need for a method and a system to selectively enable post-POR error checking in order to suppress false errors.

SUMMARY

The present invention provides a method and an apparatus for suppressing false errors of one or more circuits by selectively enabling error checkers. The method and apparatus utilizes a shifter to shift an enable bit at the rate at which the one or more circuits become initialized. Errors are suppressed if the value from the shifter corresponding to the clock cycle the one or more circuits are initialized is not enabled.

BRIEF DESCRIPTION OF THE DRAWINGS

For a more complete understanding of the present invention, and the advantages thereof, reference is now made to the following description taken in conjunction with the accompanying drawings, in which:

FIG. 3 is a schematic of a shifter that embodies features of the present invention.

DETAILED DESCRIPTION

In the following discussion, numerous specific details are set forth to provide a thorough understanding of the present invention. However, it will be obvious to those skilled in the art that the present invention may be practiced without such specific details. In other instances, well-known elements have been illustrated in schematic or block diagram form in order not to obscure the present invention in unnecessary detail. Additionally, for the most part, details concerning the operation and the implementation of electrical components, such as latches and the like, have been omitted inasmuch as such details are not considered necessary to obtain a complete understanding of the present invention, and are considered to be within the skills of persons of ordinary skill in the relevant art.

It is further noted that, unless indicated otherwise, all functions described herein may be performed in either hardware or software, or some combination thereof. In a preferred embodiment, however, the functions are implemented in hardware in order to provide the most efficient implementation. Alternatively, the functions may be performed by a processor, such as a computer or an electronic data processor, in accordance with code, such as computer program code, software, and/or integrated circuits that are coded to perform such functions, unless indicated otherwise.

Figure 1:
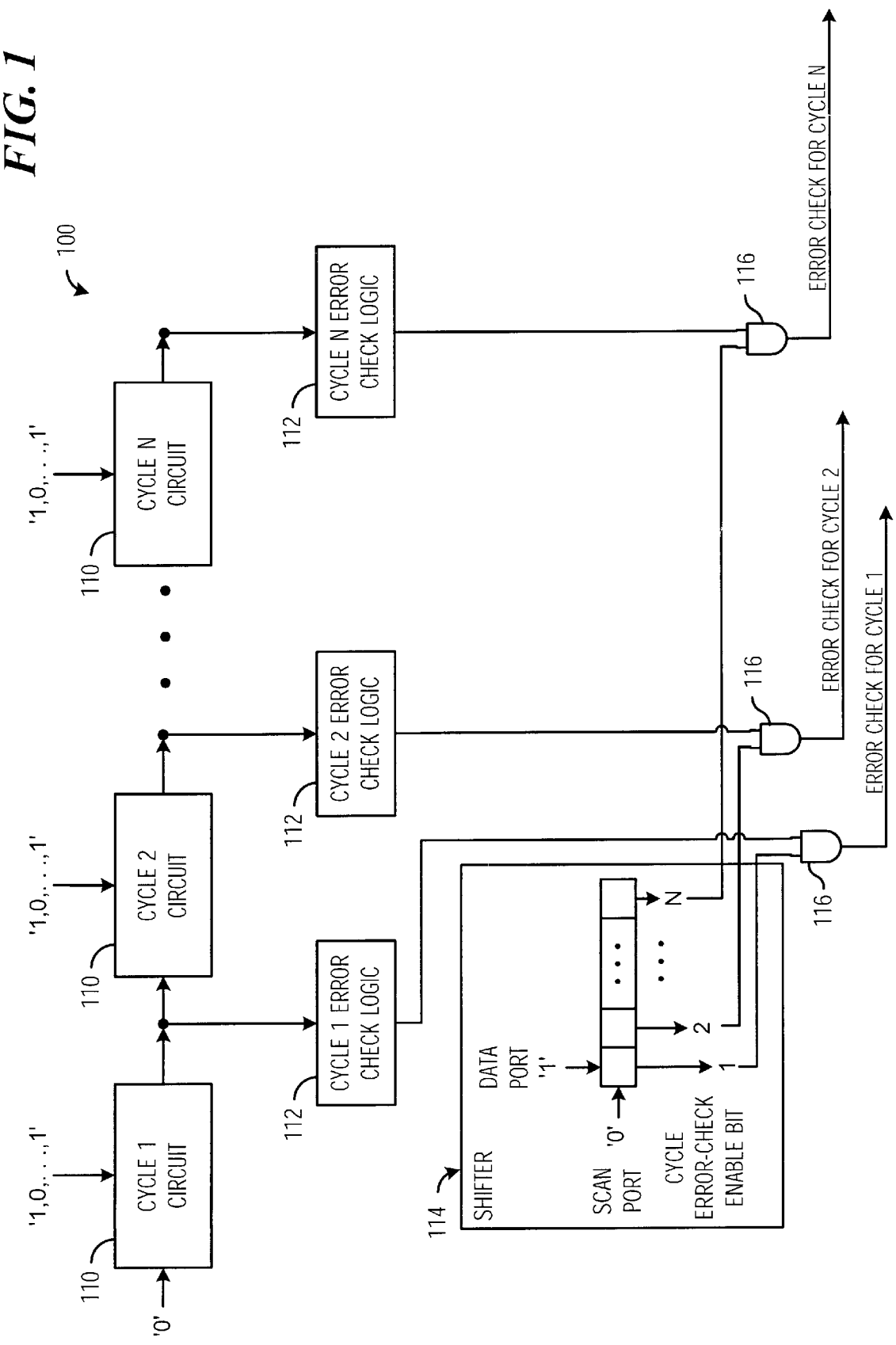
FIG. 1 is a schematic of a typical error-checking system that embodies the present invention.

Referring to FIG. 1 of the drawings, the reference numeral 100 generally designates an error-checking system embodying features of the present invention. The error-checking system 100 generally comprises one or more circuits 110, each of which is coupled to an error check logic component 112. The circuits 110, as will be discussed in greater detail below with reference to FIG. 2, generally comprises one or more electrical components, such as a latch, buffers, and/or the like. The present disclosure discusses the present invention in terms of a latch for purposes of illustration only and, therefore, the present invention should not be limited to latches in any manner. The use of the present invention with other electrical components is considered obvious to one of ordinary skill in the art upon a reading of the present disclosure and, therefore, will not be discussed in greater detail except insofar as is necessary to adequately describe the present invention.

Preferably, the circuits 110 are configurable to multiple-modes, such as a scan mode and a functional mode, and accepts data accordingly. For example, FIG. 1 illustrates that the circuits 110 each have two inputs, a reset value, e.g., a '0', and a known bit stream, such as '1, 0, . . . , 1'. Upon configuring the circuits 110 to operate in the scan mode, the reset value is latched into the circuits to initialize the circuit 110. Upon configuring the circuits 110 to operate in a functional mode, however, the known bit stream is latched into the circuits 110. It should be noted that the values of '0' and '1, 0, . . . , 1' are used for illustrative purposes only and that other values may be utilized. Furthermore, it should be noted that the known bit stream may be any value that is known by the error check logic components 112, such as random variables, values produced by a separate logic component, values from a previous cycle, and the like.

Error check logic components 112 are configured to receive one or more signals from the respective circuits 110, to compare the received signals with an expected valid value, and to indicate whether the received signals match the expected valid values. Preferably, the error check logic components 112 output a logic '1' to indicate an error, and a logic '0' to indicate a successful match. Alternatively, other values, such as a logic '0' to indicate an error, and a logic '1' to indicate a successful match, may be used to indicate similar states.

The output of the error check logic components 112 are coupled to logic ANDs 116 to receive the indication of whether the received signals match the expected values. The logic ANDs 116 are also coupled to a corresponding cycle enable bit of a shifter 114, which is discussed in further detail below with reference to FIG. 3. The shifter 114 is configured to accept as input an error-checker-suppressing value, such as a logic '0', in the scan port, which is enabled when the circuits 110 are configured to operate in the scan mode, and an error-checker-enablement value, such as a logic '1', in the data port, which is enabled when the circuits 110 are configured to operate in the functional mode. As will be discussed below, the output of the shifter 114 is initialized to all zeroes during the scan mode. Upon switching to the functional mode, logic ones are propagated through the shifter such that only the first cycle's error-check enable bit will be set, i.e., a logic '1', in the first cycle; only the first cycle's error-check enable bit and the second cycle's error-check enable bit are set in the second cycle, and so on. Therefore, the error-check logics' values will only be set if the circuitry has had an opportunity to propagate the expected valid values.

Figure 2:
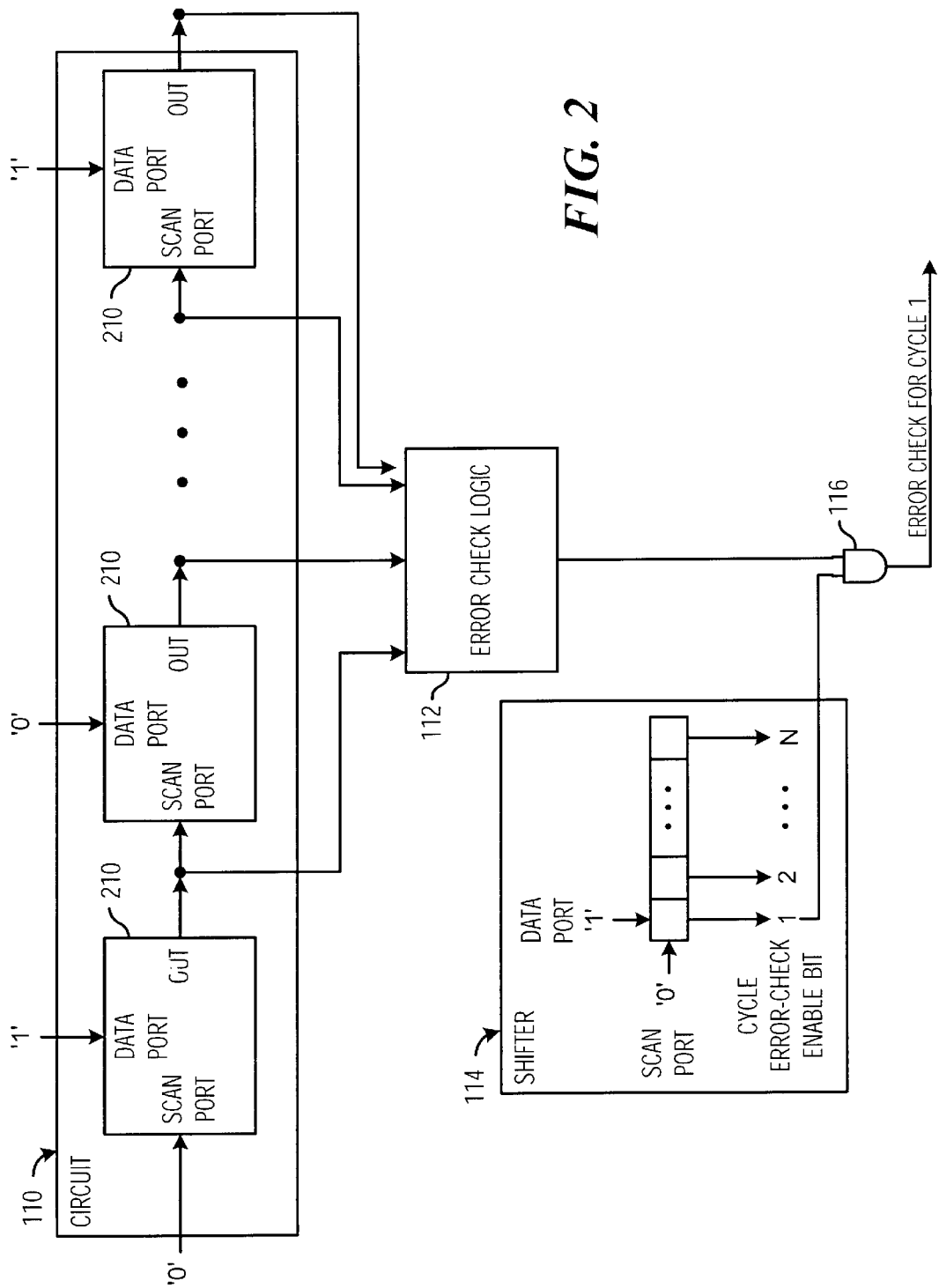
FIG. 2 is a schematic of a typical circuit that may be tested by the present invention.

FIG. 2 is a schematic diagram depicting circuitry that may be tested, discussed above with respect to the circuits 110 (FIG. 1), in accordance with a preferred embodiment of the present invention. Accordingly, the circuits 110 may comprise one or more latches 210. Each of the latches 210 are configured to comprise a scan port, which is enabled during the scan mode of the circuit 110, and a data port, which is enabled during the functional mode of the circuit 110. Preferably, the scan ports are utilized to initialize the latches 210 to a logic '0' during a scan mode. Additionally, the data ports are utilized to capture data from circuits from within the machine for the error checking. The output of each latch is coupled to the error check logic component 112 as described above. Furthermore, additional logic and circuitry (not shown) may be included within the circuits 110; particularly, it is expected that the output of each latch 210 may be attached to additional circuitry/logic prior to being sent to the error check logic 112.

FIG. 3 is a schematic diagram depicting circuitry that may be utilized as a shifter, discussed above with respect to the shifter 114 (FIG. 1), in accordance with a preferred embodiment of the present invention. Accordingly, the shifter 114 preferably comprises a series of latches 310, the number of latches preferably matching the number of cycles necessary to propagate the expected valid values throughout the circuitry being tested. As will be appreciated by one skilled in the art, the latches 310 are configured such that each latch will be initialized to a logic '0' during the scan mode and logic '1's will be propagated through the latches on each clock cycle upon entering the functional mode. The output of each latch 310 is coupled to the logic ANDs 116 and to the inputs of the next latch.

It is understood that the present invention can take many forms and embodiments. Accordingly, several variations may be made in the foregoing without departing from the spirit or the scope of the invention. For example, the polarity and/or meaning of individual bits may be reversed, additional logic and/or circuitry may be added, and the like.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered obvious and desirable by those skilled in the art based upon a review of the foregoing description of preferred embodiments. Accordingly, it is appropriate that the appended claims be construed broadly and in a manner consistent with the scope of the invention.

What is claimed is:

1. An apparatus for suppressing errors of one or more circuits, the apparatus comprising:

means for shifting a validity bit one location for each clock cycle; and means for suppressing an error of the one or more circuits if the validity bit has not been shifted to a location corresponding to the clock cycle that the one or more circuits become initialized.

2. The apparatus of claim 1, wherein the means for shifting is latches.

3. An apparatus for suppressing an error check value of one or more circuits initialized after one or more clock cycles, the apparatus comprising:

means for initializing a shifter having at least one shifter output for each clock cycle to an error-checker-suppressing value indicating the one or more circuits have not become initialized;

means for shifting an error-checker-enablement value through the shifter at a rate corresponding to the clock cycle the one or more circuits become initialized; and means for latching the error check value for the one or more circuits when the shifter output corresponding to the clock cycle that the one or more circuits becomes initialized is substantially equivalent to the error-checker-enablement value.

4. The apparatus of claim 3, wherein the means for shifting is latches.

5. An apparatus for performing an error check of a circuit comprising one or more components initialized after one or more cycles, each of the one or more components having an output signal, the apparatus comprising:

means for determining if the output signal of the one or more components is substantially equal to an expected value;

means for determining an enable bit for each clock cycle that indicates whether enough clock cycles have elapsed to initialize the circuit with input values corresponding to the expected value; and means for reporting an error condition upon a determination that the output signal is not substantially equal to the expected value and that the enable bit for the current clock cycle indicates enough clock cycles have elapsed to initialize the circuit.

6. The apparatus of claim 5, wherein the means for determining an enable bit is a shifter.

7. The apparatus of claim 5, wherein the means for determining an enable bit is a shifter comprising latches.

8. A method of suppressing errors of one or more circuits, the method comprising the steps of:

shifting a validity bit one location for each clock cycle; and suppressing an error of the one or more circuits if the validity bit has not been shifted to a location corresponding to the clock cycle that the one or more circuits become initialized.

9. The method of claim 8, wherein the step of shifting is performed by latches.

10. A method of suppressing an error check value of one or more circuits, each circuit becoming initialized after one or more clock cycles, the method comprising the steps of:

initializing a shifter having at least one shifter output for each clock cycle to an error-checker-suppressing value indicating the one or more circuits have not become initialized;

shifting an error-checker-enablement value through the shifter at a rate corresponding to the clock cycle the one or more circuits become initialized; and latching the error check value for the one or more circuits when the shifter output corresponding to the clock cycle that the one or more circuits becomes initialized is substantially equivalent to the error-checker-enablement value.

11. The method of claim 10, wherein the step of shifting is performed by latches.

12. A method of performing an error check of a circuit comprising one or more components initialized after one or more clock cycles, each of the one or more components having an output signal, the method comprising the steps of:

determining if the output signal of the one or more components is substantially equal to an expected value;

determining an enable bit for each of the two or more clock cycles that indicates whether enough clock cycles have elapsed to initialize the circuit with input values corresponding to the expected value; and reporting an error condition upon a determination that the output signal is not substantially equal to the expected value and that the enable bit for the current clock cycle indicates enough clock cycles have elapsed to initialize the circuit.

13. The method of claim 12, wherein the step of determining an enable bit is performed by a shifter.

14. The method of claim 12, wherein the step of determining an enable bit is performed by a shifter comprising latches.

15. A computer program product for suppressing an error check value of one or more circuits, each circuit becoming initialized after one or more clock cycles, the computer program product having a medium with a computer program embodied thereon, the computer program comprising:

computer program code for initializing a shifter having at least one shifter output for each clock cycle to an error-checker-suppressing value indicating the one or more circuits have not become initialized;

computer program code for shifting an error-checker-enablement value through the shifter at a rate corresponding to the clock cycle the one or more circuits become initialized; and computer program code for latching the error check value for the one or more circuits when the shifter output corresponding to the clock cycle that the one or more circuits becomes initialized is substantially equivalent to the error-checker-enablement value.

16. A computer program product for performing an error check of a circuit, comprising one or more components initialized after one or more clock cycles, each of the one or more components having an output signal, the computer program product having a medium with a computer program embodied thereon, the computer program comprising:

computer program code for determining if the output signal of the one or more components is substantially equal to an expected value;

computer program code for determining an enable bit for each of the two or more clock cycles that indicates whether enough clock cycles have elapsed to initialize the circuit with input values corresponding to the expected value; and reporting an error condition upon a determination that the output signal is not substantially equal to the expected value and that the enable bit for the current clock cycle indicates enough clock cycles have elapsed to initialize the circuit.

* * * * *